United States Patent [19]

Murata et al.

[11] Patent Number: 5,628,604

[45] Date of Patent: May 13, 1997

[54] CONVEYING SYSTEM

[75] Inventors: Masanao Murata; Teppei Yamashita; Tsuyoshi Tanaka; Teruya Morita; Hiroyuki Oyobe, all of Ise, Japan

[73] Assignee: Shinko Electric Co., Ltd., Tokyo, Japan

[21] Appl. No.: 702,800

[22] Filed: Aug. 26, 1996

Related U.S. Application Data

[63] Continuation of Ser. No. 443,016, May 17, 1995, abandoned.

[30] Foreign Application Priority Data

May 17, 1994 [JP] Japan ................ 6-126828

[51] Int. Cl.⁶ ...................................... B65G 65/00
[52] U.S. Cl. .............. 414/225; 414/283; 414/411; 414/416; 414/744.3; 414/940; 901/6
[58] Field of Search .................... 414/225, 213, 414/281, 283, 411, 416, 940, 744.3, 744.4; 901/6, 17

[56] References Cited

U.S. PATENT DOCUMENTS

| | | | |
|---|---|---|---|
| 4,532,970 | 8/1985 | Tullis et al. | 414/940 X |
| 4,775,271 | 10/1988 | Maccaferri | 414/225 |
| 4,781,511 | 11/1988 | Harada et al. | 414/940 X |
| 5,044,871 | 9/1991 | Davis et al. | 414/940 X |
| 5,382,806 | 1/1995 | Bacchi et al. | 414/940 X |
| 5,431,600 | 7/1995 | Murata et al. | 414/225 X |
| 5,468,111 | 11/1995 | Flint et al. | 414/225 X |

FOREIGN PATENT DOCUMENTS

| | | | |
|---|---|---|---|
| 150932 | 6/1988 | Japan | 414/940 |
| 155640 | 6/1989 | Japan | 414/940 |
| 102851 | 4/1991 | Japan | 414/940 |
| 288460 | 12/1991 | Japan | 414/940 |
| 189483 | 7/1992 | Japan | 414/940 |
| 17006 | 1/1993 | Japan | 414/940 |
| 299489 | 11/1993 | Japan | 414/940 |
| 48507 | 2/1994 | Japan | 414/940 |

*Primary Examiner*—David A. Bucci
*Attorney, Agent, or Firm*—Bacon & Thomas

[57] ABSTRACT

A conveying system provides a cassette accommodating workpieces; a container containing the cassette; a transferring device for conveying the cassette while supporting it or conveying the container which is empty or contains the cassette while supporting it, the transferring device having a supporting device for supporting the cassette. In the conveying system, a handle is provided on the upper surface of the container so that it is supported by the supporting device.

6 Claims, 6 Drawing Sheets

CONVEYING SYSTEM

This application is a continuation of application Ser. No. 08/443,016, filed May 17, 1995, now abandoned.

BACKGROUND OF THE INVENTION

1. Field of the Invention

This invention relates to a conveying system provided in a device of manufacturing electronic substrates such as semiconductor wafers, liquid crystal substrates and semiconductor disk to convey workpieces such as semiconductor wafers set in a container.

2. Background

For instance, semiconductor devices are manufactured in a clean room in which the atmosphere has been cleaned. As for a conveying system of conveying semiconductor wafers (hereinafter referred to merely as "wafers", when applicable) between processing stations in the clean room or stores them in a stocker, a technique is known in the art that, in order to prevent the wafers from being contaminated by dust, a wafer cassette containing the wafers is hermetically set in a portable container, and the wafer cassette thus set is conveyed or stored.

Figure 4:
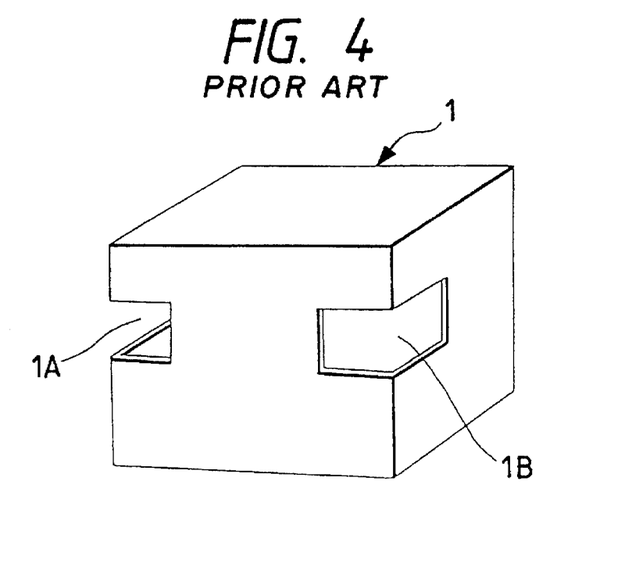
FIG. 4 is a perspective view showing an external appearance of the stocker.
Figure 5:
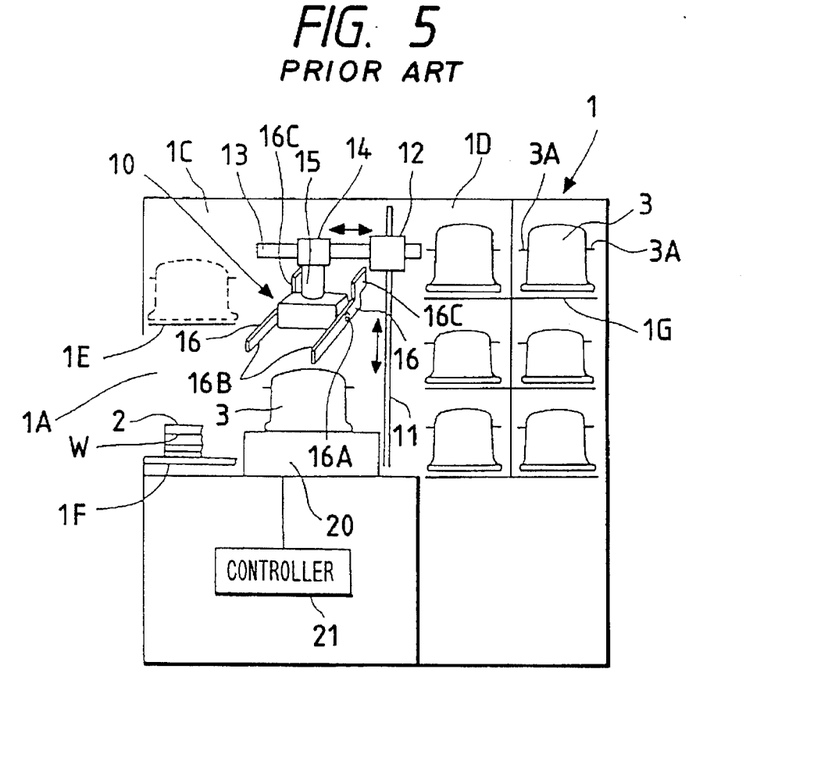
FIG. 5 is a front view showing the internal arrangement of a stocker in which a conventional conveying system is provided.
Figure 6A:
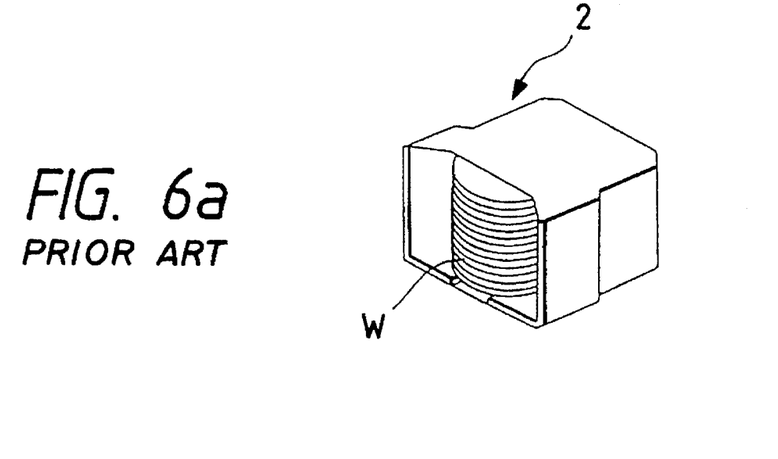
FIG. 6a is a perspective view showing the structure of a cassette in the conventional conveying system.
Figure 6B:
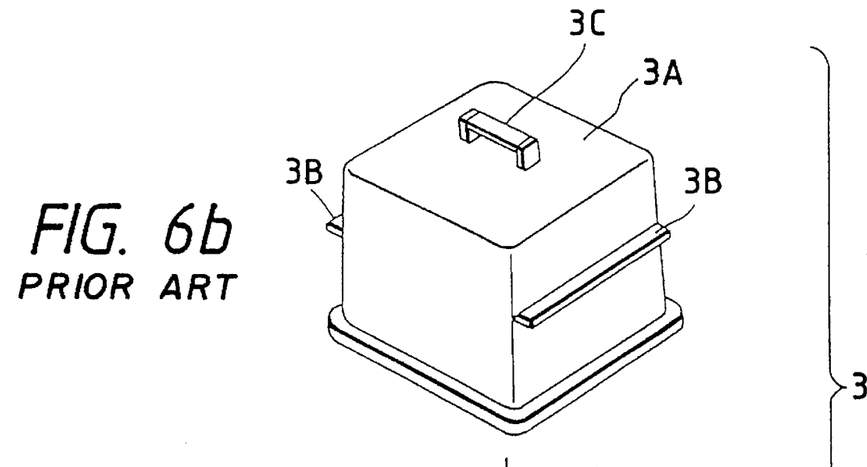
FIG. 6b is a perspective view showing the structure of a container body in the conventional conveying system.
Figure 6C:
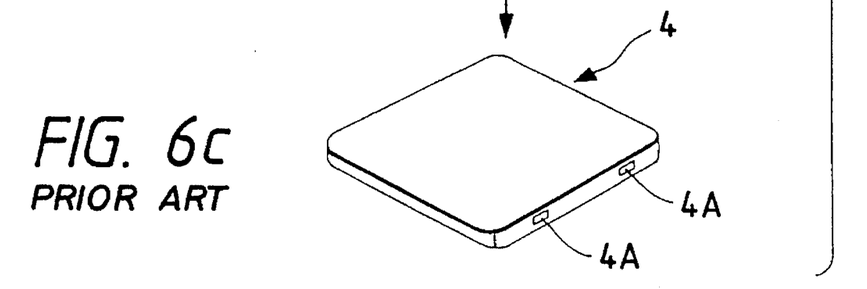
FIG. 6c is a perspective view showing the structure of a bottom lid in the conventional conveying system.

FIG. 4 is a perspective view of a semiconductor stocker 1 of this type, and FIG. 5 is a front view showing the inside of the semiconductor stocker 1. The stocker 1 has a cassette entrance 1A and a container entrance 1B (shown only in FIG. 4). The stocker 1 has a workpiece transferring chamber 1C on the side of the cassette entrance 1A, and a container storing chamber 1D on the side of the container entrance 1B. FIG. 6a is a diagram showing a cassette 2, FIG. 6b is a diagram showing a container body 3A, and FIG. 6c is a diagram showing a bottom lid 4 engaged with the container body 3A. A container 3 is formed by combining the bottom lid 4 with the container body 3A.

The cassette 2 is in the form of a box with one end opened. A plurality of wafers W (usually twenty-five (25) wafers) are stacked in the cassette 2 in such a manner that they are spaced from one another. The container body 3A is in the form of a box with no bottom. A pair of handles 3B and 3B are secured to right and left side walls of the container body 3A, and a handle 3C is secured to the top wall of the container body 3A. The handles 3B are to be held by a robot 10 (described later), and the handle 3A is to be held by an operator. The bottom lid 4 is engaged with the bottom of the container body 3A. More specifically, the bottom lid 4 is detachably engaged with the container body 3A as follows: The bottom lid 4 has lock arms (not shown) inside it, and holes 4A in the side surfaces through which the end portions of the lock arms are extended outside. The end portions of the lock arms extended through the holes 4A are inserted into recesses (not shown) formed in the inner surfaces of the side walls of the container body 3A. Thus, the bottom lid 4 is detachably engaged with the container body 3A. The arrangements of those structures will be described with reference to an embodiment of the invention in detail.

The cassette 2 is accommodated in the container 3 as follows: First, the cassette 2 is positioned on the bottom lid 4 as required. For this purpose, a positioning piece (not shown) is provided on the upper surface of the bottom lid 4, and a guide (not shown) is provided on the bottom of the cassette 2. The guide of the cassette 2 is engaged with the positioning piece of the bottom lid 4 so that the cassette 2 is correctly positioned on the bottom lid 4. Under this condition, the cassette 2 is covered with the container body 3A from above, and then the end portions of the lock arms are protruded through the holes 4A from the bottom lid 4, so that the latter 4 is fixedly secured to the container body 3A to form the container 3. The container 3 thus formed is moved into the container storing chamber 1D. As the case may be, the container 3 is taken out of the container storing chamber 1D and moved out of the stocker 1 through the container entrance 1B. The above-described operations are carried out by a robot 10 provided inside the stocker 1.

In FIG. 5, reference numeral 11 designates a Y-axis guide rail for the vertical movement of the robot 10. The Y-axis guide rail 11 is supported by a slider (not shown) in such a manner that it together with the slider is movable in a direction (Z-axis) perpendicular to the surface of the drawing. A first slider 12 is supported by the Y-axis guide rail 11 in such a manner that it is vertically movable. An X-axis guide rail 13 is secured to the Y-axis guide rail 11. A second slider 14 is supported by the X-axis guide rail 13 in such a manner that it is movable longitudinally of the latter 13. The robot 10 is coupled through a turning shaft 15 to the bottom of the second slider 14.

Figure 7:
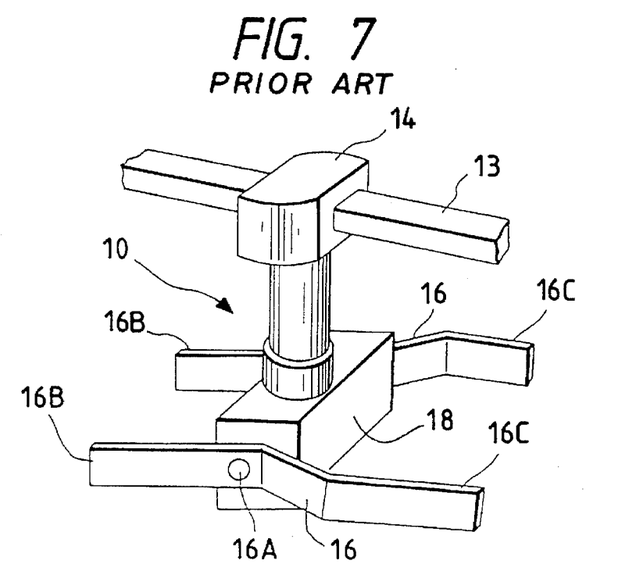
FIG. 7 is a perspective view showing the fingers of a robot in detail which is employed in the conventional conveying system.

The robot 10 is shown in FIG. 7 in detail. The robot 10 includes a hand 18 which has a pair of finger members 16 on both sides thereof. Both end portions of each of the finger members 16 are formed into fingers 16B and 16C, respectively. The hand 18 is a gear box for changing a turning movement of the turning shaft 15 to an opening and closing movement of the fingers 16B and 16C, shafts 16A provided on both sides of the hand 18 have a function to communicate a motive power from the hand 18 to the fingers 16B and 16C, respectively. Thus the fingers 16B and 16C are movable to and from each other. The fingers 16B are to hold the cassette 2. The fingers 16C are to hold the container 3 or to support the handles 3B from below. The distance between the fingers 16C is larger than that between the fingers 16B. Switching the use of the fingers 16B over to the use of the fingers 16B and vice versa is achieved by turning the hand 18 about the turning shaft 15. In FIG. 5, reference numeral 20 designates a lock/unlock device which drives the lock arms of the bottom lid 4 to connect the latter 14 to the container body 3A or to disconnect the bottom lid 4 from the latter 3A; and 21, a controller for controlling all the internal elements in the stocker 1. Further in FIG. 5, reference character 1E designates a temporary container stand; 1F, a cassette stand; and 1G, shelves on which containers 3 are placed. In the above-described stocker, one robot is provided, and its fingers 16B and 16C are selectively used. On the other hand, a stocker is known in the art in which a robot is provided for handling cassettes, and another robot is provided for handling containers; more specifically, the former robot has fingers for handling cassettes only, and the latter robot has fingers for handling containers only.

In the case of the above-described stocker 1, the cassette 2 containing wafers W is handled as follows: That is, the cassette 2 is carried in the stocker 1, and stored therein, and carried out of the stocker 1 as follows: First, the robot 10 holds an empty container 3 in the container storing chamber 1D, and takes it out of the container storing chamber 1D and places it on the lock/unlock device 20. Under this condition, the lock/unlock device 20 drives the lock arms provided in the bottom lid 4 to disengage the latter 4 from the container body 3A. Next, the robot 10 places the container body 3A on the temporary container stand 1E leaving the bottom lid 4 on the lock/unlock device 20. There-after, the robot 10 switches the fingers 16C over to the fingers 16B; that is, it uses the fingers 16B to move a cassette 2 from the cassette stand 1F, and places it on the bottom lid 4. Next, the robot 10 switches the fingers 16B over to the fingers 16C; that is, the robot 10 uses the fingers 16C to pick up the container body 3A from the temporary container stand 1E and places it on the upper surface of the lock/unlock device 20 in such a manner that the container body 3A covers the cassette 2 from above. In this operation, the bottom lid 4 is engaged with the bottom of the container body 3A. Under this condition, the lock/unlock device 20 drives the lock arms in the bottom lid 4 to secure the latter 4 to the container body 3A. Thus, the cassette has been accommodated in the container 3. Thereafter, the robot 10 moves the container 3 containing the cassette 2 to the container storing chamber 1D, and places it on a predetermined shelf in the container storing chamber. On the other hand, when requested, the robot 10 picks up a container 3 containing a cassette 2 with the fingers 16C, and takes it out of the stocker through the container entrance 1B.

In the above-described conveying system for the stocker, depending on the item (the cassette or the container) to be moved by the robot, two kinds of fingers are selectively used by turning them 180 degrees. Hence, the system suffers from the following difficulties:

(1) The hand and finger members of the robot are unavoidably intricate and bulky, and therefore it is impossible for the robot to make sharp turns; that is, the robot is limited in the range of movement.

(2) The movable weight including the weight of the finger members of the robot is limited. Therefore, if the hand is increased in weight, the movable weight is limited as much.

(3) Since the hand and finger members of the robot are intricate, bulky and heavy, the conveying system including the robot is relatively high in manufacturing cost.

SUMMARY OF THE INVENTION

An object of the invention is to eliminate the above-described difficulties. More specifically, an object of the invention is to provide a conveying system in which the finger members of a robot are simplified in structure and reduced in weight, and the above-described difficulties have been eliminated.

The foregoing object of the invention has been achieved by the provision of a conveying system comprising: a cassette adapted to accommodate workpieces; a container adapted to contain the cassette; a transferring device for conveying the cassette or the container containing the cassette while supporting the cassette or the container, the transferring device having a supporting device for supporting the cassette or the container, in which, according to the invention, a handle is provided on the upper surface of the container in such a manner that the handle can be supported by the supporting device.

More specifically, in the conveying system, the supporting device comprises a hand having a pair of fingers which are movable to and from each other, the fingers are adapted to hold the cassette, and the width of the handle provide on the upper surface of the container is so determined that the handle can be held with the fingers. That is, in the conveying system, the distance between the parts of side portions of the handle which are held by the fingers is substantially equal to the distance between the parts of side surfaces of the cassette which are held with the fingers.

In addition, the handle is so designed that the handle can be supported by the supporting device from below.

In the conveying system of the invention, the supporting device for supporting the cassette can be used to support the container. That is, supporting the cassette and the container can be achieved without exchanging or switching the parts of the supporting device.

DETAILED DESCRIPTION OF THE PREFERRED EMBODIMENTS

Figure 1:
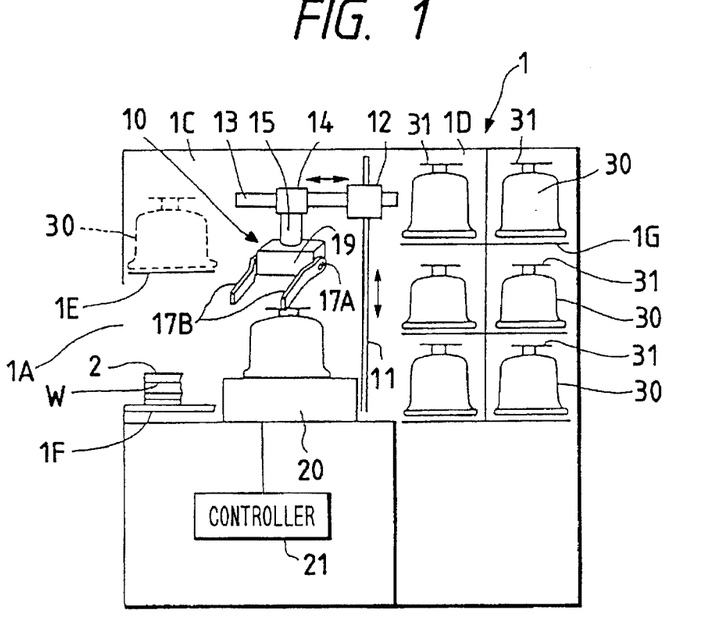
FIG. 1 is a front view showing the internal arrangement of a stocker in which a conveying system, which constitutes an embodiment of the invention, is provided.

A conveying system, which constitutes an embodiment of this invention, will be described with reference to FIGS. 1 through 3. FIG. 1 is a diagram showing a stocker 1 in which the conveying system is provided. The stocker 1 is located adjacent to a surface treatment equipment such as a washing device in a clean room. In FIG. 1, parts corresponding functionally to those which have been described with reference to FIG. 5 are therefore designated by the same reference numerals or characters.

A robot 10, similarly as in the case of the robot shown in FIG. 5, is rotatable around a turning shaft 15, and is movable horizontally and vertically. The robot 10 is able to move a container 30 or a container body 30A between the temporary container stand 1E, the lock/unlock device 20, the shelves 1G, and the container entrance 1B (cf. FIG. 4), and to move a cassette 2 between the cassette stand 1F and the lock/unlock device 20. The robot 10 includes a hand 19. The hand 19 has a pair of fingers 17B on both sides thereof.

Figure 3:
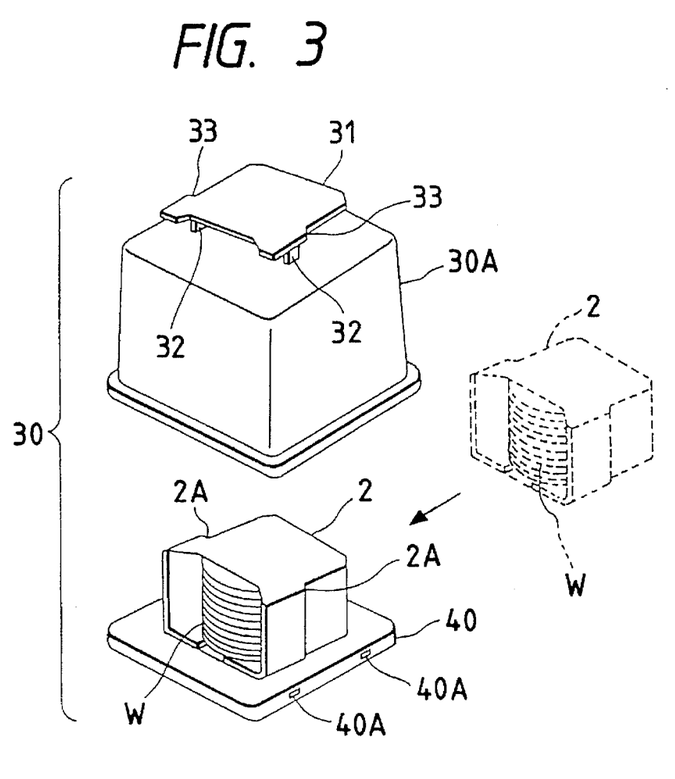
FIG. 3 is a perspective view showing the container and a cassette which are employed in the conveying system of the invention.

FIG. 3 shows the container body 30A, the cassette 2 containing wafers (or workpieces) W, and a bottom lid 40. The container body 30A and the bottom lid 40 form the container 30. The container body 30A is in the form of a box with no bottom. Similarly as in the case of the conventional container, the bottom lid 40 is detachably engaged with the bottom of the container body 30A. A handle 31 is secured through spacers 32 to the upper surface of the container body 30A. The handle 31 is substantially equal in size and in configuration to the section of the upper portion of the cassette 2, therefore a distance between a side portions of the handle 31 which are held by the fingers 17B are substantially equal to a distance between a side surfaces of the cassette 2 which are held with the fingers 17B.

Figure 9:
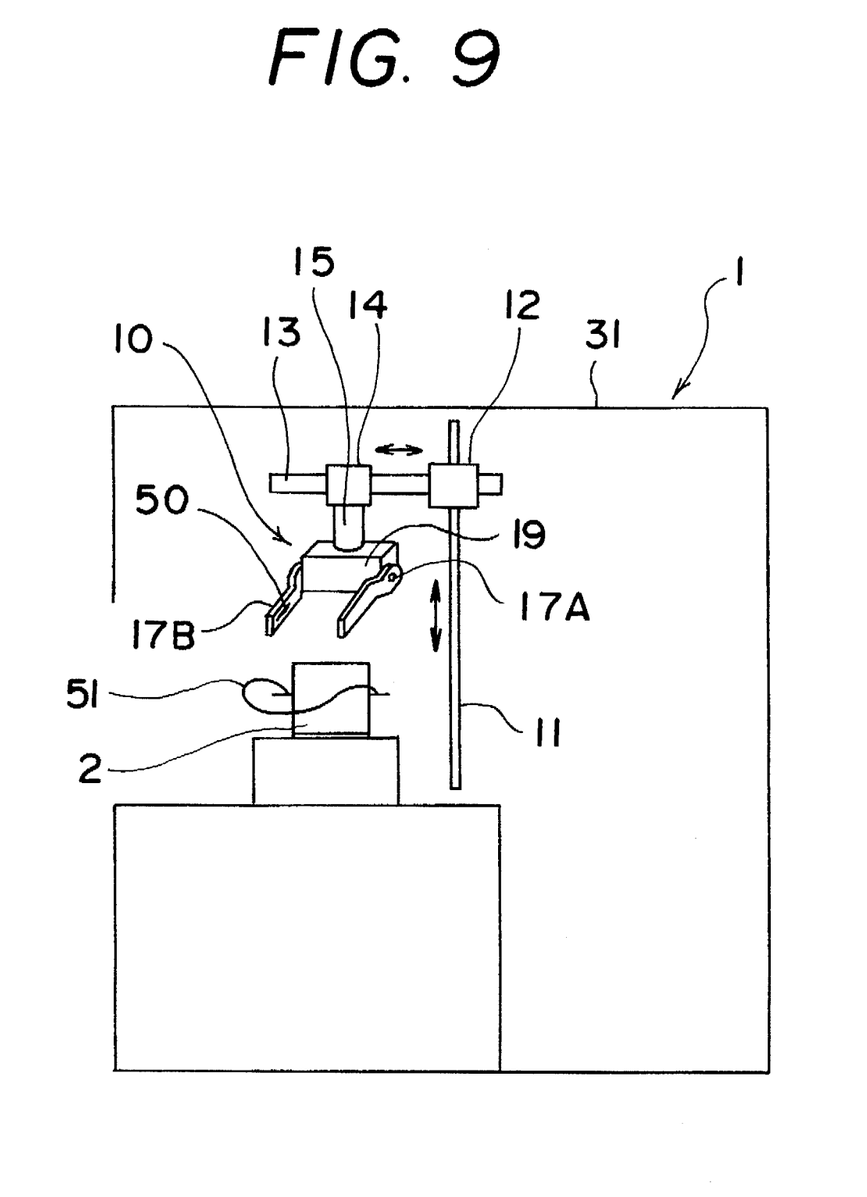
FIG. 9 is a front view showing the internal arrangement of a stocker corresponding to that illustrated in FIG. 1, but in which the robot arms of the stocker include grooves capable of engaging a handle of the containers or flanges on the sides of a cassette.

The container body 30A or container 30 which is designed as described above is moved by the robot 10 as follows: That is, the robot 10 picks up the handle 31 of the container body 30A or the container 30 with the fingers 17B, and moves it to a specified position. On the other hand, the fingers 17B hold right and left side walls of the cassette 2. The cassette 2 and the fingers 17B may be modified in various manners. For instance, as shown in FIG. 9, grooves 50 may be formed in the inner surfaces of the fingers 17B and 17B which are confronted with each other so that the handle 31 is engaged with the grooves. In addition, as also shown in FIG. 9, a flange 51 which is similar in configuration to the handle 31 may be formed on the side walls of the cassette 2 so that the flange is engaged with the grooves formed in the fingers 17B, or the fingers 17B support the flange from below.

Figure 2:
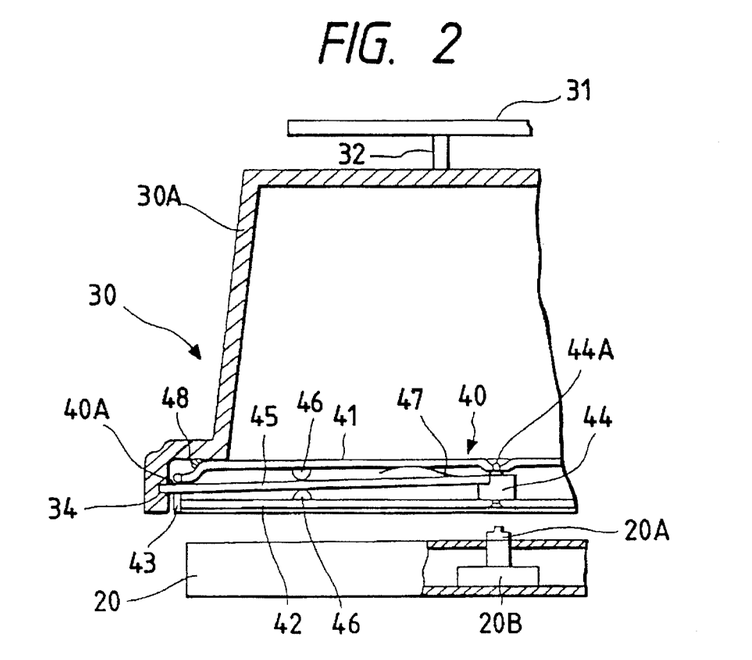
FIG. 2 is a sectional view showing a container in detail which is employed in the conveying system of the invention.

FIG. 2 shows the container body 30A and the bottom lid 40 in more detail. The lower end portions of the side walls of the container body 30A which define the opening of the latter 30A are more spread outwardly than the remaining portions, and the bottom lid 40 is set in the space defined by the lower end portions of the side walls. The bottom lid 40 is in the form of a relatively flat rectangular box which is made up of a top plate 41, a bottom plate 42 and side plates 43. Cam 44 is arranged inside the bottom lid 40. A pin 44A is formed on each of the cam 44 at the center. The pin 44A is inserted into the top plate 41 of the bottom lid 40 so that the cam 44 is rotatably supported. The cam 44 is engaged with one end portion of a plate-shaped lock arm 45. Hence, as the cam 44 is turned, the lock arm 45 is moved right and left as viewed in FIG. 2. As the lock arm 45 is moved in this way, its end portion is protruded from the bottom lid 40 through a hole 40A or retracted into it, thus being engaged with or disengaged from a recess 34 formed in the inner surface of the container body 30A. In FIG. 2, reference numeral 46 designates fulcrum members which tiltably support the lock arm 45; 47, a leaf spring which presses the lock arm 45 against the cam 44; and 48, a packing which seals the container so that the inside of the container 30 is hermetically isolated from the outside. That is, the packing 48 is secured to the container body 30A or the bottom lid 40.

The lock/unlock device 20 has cam shaft 20A which is rotatably supported by cam driving mechanism 20B. The end portion of the cam shaft 20A is extended into the respective cam 44 through the bottom plate 42 of the bottom lid 40, and spline-engaged with the cam 44. In placing the bottom lid 40 on the lock/unlock device 20, the container 30 is so positioned that the end portion of the cam shaft 20A are inserted into the cam 44.

The operations of the conveying system thus organized will be described.

(I) Cassette Stocking (Receiving) Operation (1) A cassette 2 containing wafers W which have been surface-treated by the washing device in the clean room is taken out of the washing device, and placed on the cassette stand 1F provided adjacent to the cassette entrance 1A.

(2) The robot moves to a specified shelf 1G in the container storing chamber 1D, and holds the handle 31 of an empty container 30, and moves the container 30 over to the lock/unlock device 20, and places it on the latter 20. In this case, the container 30 is so positioned that the cam shaft 20A of the lock/unlock device 20 are inserted into the cam 44 of the bottom lid 40 secured to the container body 30A.

(3) The cam shaft 20A are turned to move the lock arms 45 to disengage the latter 45 from the recesses 34 of the container 30A, so that the bottom lid 40 is disengaged from the container body 30A.

(4) The robot 10 holds the handle 31 of the container body 30A set on the lock/unlock device 20, and moves the container body 30A to the temporary container stand 1E leaving the bottom lid 40 on the lock/unlock device 20.

(5) The robot 10 holds the right and left side walls of cassette 2 with its fingers 17B which has been placed on the cassette stand 1F, and places the cassette 2 on the bottom lid 40 set on the lock/unlock device 20.

(6) The robot 10 moves the container body 30A from the temporary container stand 1E to the lock/unlock device 20, and places it on the latter 20 in such a manner that the cassette 2 is covered with the container body 30A. In this operation, the bottom lid 40 is fitted in the bottom of the container body 30A.

(7) The cam shaft 20A of the lock/unlock device 20 is turned to drive the lock arms 45. As a result, the end portions of the lock arms 45 are protruded from the bottom lid 40 through the holes 40A and inserted into the recesses 34 of the container body 30A. Thus, the bottom lid 40 is fixedly secured to the container body 30A; that is, the container 30 is formed. In this operation, the packing hermetically isolates the inside of the container 30 from the outside.

(8) The robot 10 moves the container 30 containing the cassette 2 while holding the handle 3 of the container 30, and places it on the predetermined shelf 1G in the container storing chamber 1D. The container 30 is stored in the container storing chamber 1D as it is until an instruction is issued to ship it.

(II) Container or Cassette Shipping Operation

In the shipping operation, two shipping instructions are employed. One of the two shipping instructions is to ship the container 30 containing the cassette 2, and the other is to ship the cassette only. In response to those shipping instructions, the robot 10 operates as follows:

(a) Shipping the Container Containing the Cassette

The robot 10 moves the container 30 from the predetermined shelf 1G to the stand (not shown) near the container entrance 1B (cf. FIG. 4).

(b) Shipping the Cassette Only (1) The robot 10 moves the container 30 containing the cassette 2 over to the lock/unlock device 20.

(2) The lock/unlock device 20 turns the cam shaft 20A to drive the lock arms 45 thereby to disengage the bottom lid 40 from the container body 30A.

(3) The robot 10 moves the container body 30A from the lock/unlock device 20 to the temporary container stand 1E and places it on the latter 1E.

(4) The robot 10 picks up the cassette 2 from the bottom lid 40, and places it on the cassette stand 1F.

(5) The robot 10 moves the container body 30A from the temporary container stand 1E to the lock/unlock device 20, and places it on the latter 20.

(6) The lock/unlock device 20 turns the cam shaft 20A to drive the lock arms 45 thereby to engage the bottom lid 40 with the container body 30A. Thus, an empty container 30 has been formed.

(7) The robot 10 moves the empty container 30 from the lock/unlock device 20 to a predetermined shelf 1G in the container storing chamber 1D, and places it on the shelf 1G.

In the above-described conveying system, the handle 31 which can be supported with the fingers 17B is secured to the upper surface of the container body 30A. Hence, the robot 10 is able to move not only the cassette 2 but also the container 30 or the container body 30A. As is apparent from the above description, the robot 10 has only one kind of fingers to move the cassette and the container. Hence, the fingers 17B of the robot 10 can be reduced in size, simplified in structure, and decreased in weight. Hence, the robot 10 according to the invention is able to make sharp turns, and can be simplified in arrangement, and reduced in manufacturing cost. In addition, the fingers 17B can be reduced in weight, whereby the weight of workpieces handled by the robot can be increased as much.

In the above-described embodiment, the handle 31 is formed at the container body 30A, and is substantially equal in size and in configuration to the section of the cassette 2. Therefore, the fingers 17B can support the container 30 just the same as the cassette 2. As a result, a movement of the fingers 17B is simplify, furthermore, it is possible to simplify controlling the robot 10.

In the above-described embodiment, the handle 31 is substantially equal in size and in configuration to the section of the cassette 2. However, the size of the handle 31 may be somewhat changed as long as the handle 31 can be supported with the fingers 17B. That is, the size of the handle 31 may be changed according to the stroke of opening the fingers 17B.

In the above-described embodiment, the cassette 2 or the handle 31 of the container 30 is held with the fingers 17B. However, since the handle 31 is secured through the spacers 32 to the container 30, the robot 10 may be so designed that the fingers 17B are inserted into the space formed below the handle 31 to pick up the container 30. In addition, in the above-described embodiment, the fingers 17B hold the cassette 2 from both sides; however, the invention is not limited thereto or thereby. That is, the cassette 2 may be modified as follows: Handles (or flanges) are fixedly secured to the right and left side walls of the cassette 2 so that the fingers lift the cassette 2 from below the handles. In this case, the robot 10 may have fingers which are not movable to and from each other.

Figure 8:
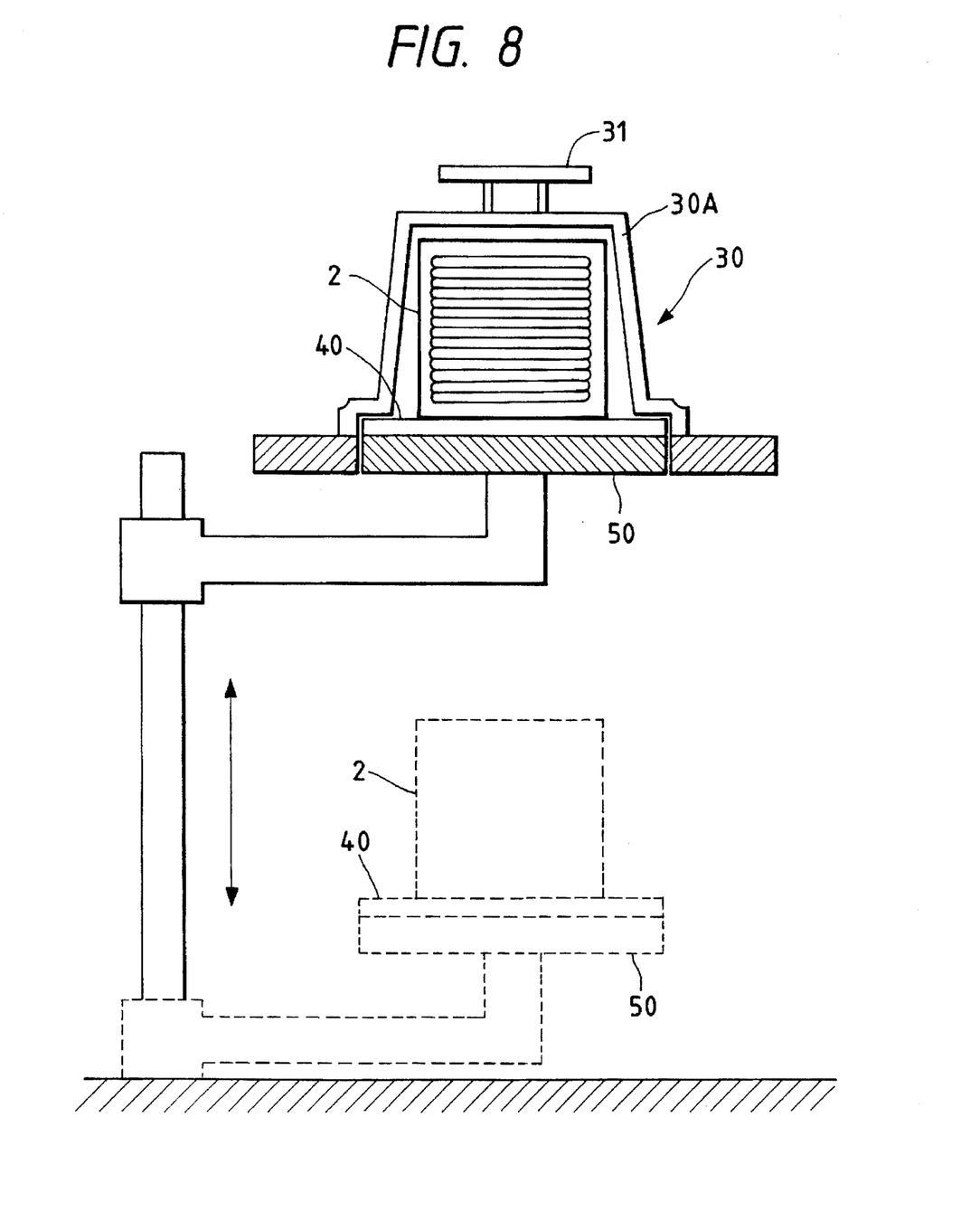
FIG. 8 is a sectional view showing a lifting stand in detail which is another embodiment in the conveying system of the invention.

In the above-described embodiment, the cassette 2 is placed on the bottom lid 40, and then it is covered with the container body 30A from above; however, the invention is not limited thereto or thereby. For instance, as shown in FIG. 8, a lifting stand 50 is provided in such a manner that it is movable to and from the upper surface of the lock/unlock device 20, and the bottom lid 40 and the cassette 2 are placed on the lifting stand 50. Under this condition, the cassette 2 is accommodated in the container body 30A through the open bottom which is set on the upper surface of the lifting stand 50. Thereafter, the bottom lid 40 is fixedly engaged with the container body 30A.

In the above-described embodiment, the technical concept of the invention is applied to the wafer stocker; however, the invention is not limited thereto or thereby. That is, the technical concept of the invention may be applied to an apparatus which manufactures electronic substrates such as liquid crystal display substrates and semiconductor disks.

As was described above, in the conveying system of the invention, the handle which can be supported with the supporting device provided for the cassette is secured to the upper surface of the container. Hence, one kind of fingers may be used for moving the container as well as the cassette. Hence, in the conveying system, the transferring device is simplified in structure and reduced in size, which contributes to reduction of the manufacturing cost.

What is claimed is:

1. In a conveying system comprising:

a cassette arranged to accommodate a workpiece;

a container arranged to contain said cassette;

container transferring means for transferring a container to a position in a sealed area where a cassette can be loaded or unloaded into or from the container and for transferring the container away from said position; and cassette transferring means for transferring said cassette to or from said position, the improvement comprising:

said cassette transferring means and said container transferring means including a single supporting means for supporting not only said cassette but also said container, said supporting means including a hand having a pair of fingers which are movable to and from each other; and a handle provided on an upper surface of said container in such a manner that said handle can be supported by said supporting means, wherein a distance between side portions of said handle which are held by said fingers when the container is supported by the supporting means is substantially equal to a distance between side surfaces of said cassette which are held by said fingers when the cassette is supported by said supporting means.

2. The conveying system as claimed in claim 1, wherein said fingers are substantially extended in one direction from shafts disposed on both sides of said hand, respectively.

3. The conveying system as claimed in claim 1, wherein said handle is so designed that said handle can be supported by said supporting means from below.

4. The conveying system as claimed in claim 1, wherein said fingers have grooves formed at inner surfaces of said fingers confronted with each other, respectively, said grooves engage flanges formed on side walls of said cassette, respectively.

5. The conveying system as claimed in claim 4, wherein said grooves also engage side portions of said handle provided on a top surface of the cassette, and a distance between said side portions of said handle is substantially equal to a distance between said flanges of said cassette which engage said grooves.

6. The conveying system as claimed in claim 5, wherein said fingers are substantially extended in one direction from shafts disposed on both sides of said hand, respectively.

* * * * *